US009397161B1

(12) United States Patent
Cheng et al.

(10) Patent No.: US 9,397,161 B1
(45) Date of Patent: Jul. 19, 2016

(54) REDUCED CURRENT LEAKAGE SEMICONDUCTOR DEVICE

(71) Applicant: International Business Machines Corporation, Armonk, NY (US)

(72) Inventors: Cheng-Wei Cheng, White Plains, NY (US); Pranita Kerber, Mount Kisco, NY (US); Young-Hee Kim, Mohegan Lake, NY (US); Effendi Leobandung, Stormville, NY (US); Yanning Sun, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/631,886

(22) Filed: Feb. 26, 2015

(51) Int. Cl.
| | |
|---|---|
| *H01L 21/205* | (2006.01) |
| *H01L 29/08* | (2006.01) |
| *H01L 29/06* | (2006.01) |
| *H01L 29/66* | (2006.01) |
| *H01L 29/78* | (2006.01) |
| *H01L 29/20* | (2006.01) |
| *H01L 29/205* | (2006.01) |
| *H01L 29/207* | (2006.01) |
| *H01L 29/36* | (2006.01) |
| *H01L 29/38* | (2006.01) |
| *H01L 21/18* | (2006.01) |
| *H01L 21/20* | (2006.01) |

(52) U.S. Cl.
CPC ........ *H01L 29/0847* (2013.01); *H01L 29/0603* (2013.01); *H01L 29/0843* (2013.01); *H01L 29/66492* (2013.01); *H01L 29/66636* (2013.01); *H01L 29/7833* (2013.01)

(58) Field of Classification Search
None
See application file for complete search history.

(56) References Cited

U.S. PATENT DOCUMENTS

| | | | |
|---|---|---|---|
| 6,268,640 B1 | 7/2001 | Park et al. | |
| 6,437,406 B1 | 8/2002 | Lee | |
| 6,949,796 B1 | 9/2005 | Ellis-Monaghan et al. | |
| 7,595,247 B2 | 9/2009 | Dokumaci et al. | |
| 7,601,569 B2 | 10/2009 | Cai et al. | |
| 8,148,218 B2 | 4/2012 | Chang | |
| 8,269,284 B2 | 9/2012 | Nil et al. | |
| 8,361,872 B2 * | 1/2013 | Cai | H01L 21/26586 257/408 |
| 8,741,703 B2 | 6/2014 | Zhu | |
| 8,802,533 B1 * | 8/2014 | Qin | H01L 29/7833 257/344 |
| 8,853,008 B1 | 10/2014 | Lee | |

(Continued)

OTHER PUBLICATIONS

Rosenthal, P. A., Y. Taur, and E. T. Yu. "Direct Measurement and Characterization of N+ Superhalo Implants in a 120 Nm Gate-length Si Metal-oxide-semiconductor Field-effect Transistor Using Cross-sectional Scanning Capacitance Microscopy." Appl. Phys. Lett. Applied Physics Letters 81.21 (2002): 3993.*

(Continued)

*Primary Examiner* — Joseph Schoenholtz
(74) *Attorney, Agent, or Firm* — Steven F. McDaniel

(57) ABSTRACT

A method for fabricating a semiconductor device may include receiving a gated substrate comprising a substrate with a channel layer and a gate structure formed thereon, over-etching the channel layer to expose an extension region below the gate structure, epitaxially growing a halo layer on the exposed extension region using a first in-situ dopant and epitaxially growing a source or drain on the halo layer using a second in-situ dopant, wherein the first in-situ dopant and the second in-situ dopant are of opposite doping polarity. Using an opposite doping polarity may provide an energy band barrier for the semiconductor device and reduce leakage current. A corresponding apparatus is also disclosed herein.

20 Claims, 4 Drawing Sheets

(56) References Cited

U.S. PATENT DOCUMENTS

| | | | |
|---|---|---|---|
| 2008/0242037 A1* | 10/2008 | Sell | H01L 21/30608 438/299 |
| 2012/0034748 A1* | 2/2012 | Shin | H01L 21/26586 438/300 |
| 2012/0153387 A1* | 6/2012 | Murthy | H01L 21/28512 257/335 |
| 2013/0069164 A1* | 3/2013 | Marino | H01L 21/823431 257/369 |
| 2014/0217519 A1* | 8/2014 | Qin | H01L 29/7833 257/408 |

OTHER PUBLICATIONS

Gong et al., "Source/Drain Engineering for In0:7Ga0:3As N-Channel Metal-Oxide-Semiconductor Field-Effect Transistors: Raised Source/Drain with In situ Doping for Series Resistance Reduction", Japanese Journal of Applied Physics 50 (2011) pp. 04DF01-1 to 04DF01-4, DOI: 10.1143/JJAP.50.04DF01, © 2011 The Japan Society of Applied Physics.

Lee et al., "High performance raised source/drain InAs/In0.53Ga0.47As channel metal-oxide-semiconductor field-effect-transistors with reduced leakage using a vertical spacer", Applied Physics Letters 103, 233503 (2013), pp. 233503-1 to 233503-4, © 2013 AIP Publishing LLC.

Singisetti et al., "InGaAs channel MOSFET with self-aligned source/drain MBE regrowth technology", Phys. Status Solidi C 6, 1394-1938 (2009) / DOI 10.1002/pssc.200881532, © 2009 WILEY-VCH Verlag GmbH & Co. KGaA, Weinheim.

Sun et al., "Self-Aligned III-V MOSFETs: Towards A CMOS Compatible and Manufacturable Technology Solution", © 2013 IEEE, pp. 2.7.1-2.7.4, IEDM13-48.

Cheng et al., "Reduced Current Leakage Semiconductor Device", U.S. Appl. No. 15/092,724, filed Apr. 7, 2016, 18 pages.

IBM Appendix P, list of patents and patent applications treated as related, Apr. 7, 2016, 2 pages.

* cited by examiner

REDUCED CURRENT LEAKAGE SEMICONDUCTOR DEVICE

BACKGROUND OF THE INVENTION

The present invention relates generally to semiconductor devices and device fabrication and more particularly to reducing leakage current in such devices.

One of the challenges in scaling transistors to smaller geometries is controlling leakage current while increasing drive current. This is particularly problematic for III-V semiconductors due to their narrow band gap and increased short channel effects.

SUMMARY

A semiconductor device (i.e., apparatus) with reduced current leakage and a method for fabricating the semiconductor device are disclosed herein. In one embodiment, the method includes receiving a gated substrate comprising a substrate with a channel layer and a gate structure formed thereon, over-etching the channel layer to expose an extension region below the gate structure, epitaxially growing a halo layer on the exposed extension region using a first in-situ dopant and epitaxially growing a source or drain on the halo layer using a second in-situ dopant, wherein the first in-situ dopant and the second in-situ dopant are of opposite polarity.

In one embodiment, the semiconductor device includes a substrate with a channel formed over the substrate, a halo layer that is epitaxially grown and covers a sidewall of the channel and a portion of the substrate that is lateral to the channel, and a source or drain formed over the halo layer that is epitaxially grown. In some embodiments, the halo layer comprises a first in-situ dopant and the source or drain comprises a second in-situ dopant that has an opposite doping polarity than the first in-situ dopant. Using an opposite doping polarity may provide an energy band barrier for the semiconductor device and reduce leakage current.

DETAILED DESCRIPTION

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

The scope of the present invention is to be determined by the claims. Accordingly any features, characteristics, advantages, or the like, discussed below in the discussion of embodiments of this specification shall not be taken to mean that such features, characteristics, advantages, or the like are required to practice the present invention as defined by the claims.

Some embodiments disclosed herein reduce leakage current in semiconductor devices including III-V semiconductor devices.

One approach to reducing current leakage is to provide a "halo" region in the extension region of a semiconductor device by angled ion implantation. However, the bombardment of ions during ion implantation may create amorphous regions on the device. Furthermore, the implant profile, used during angled ion implantation, is often difficult to control so that the resulting halo region is not optimally doped with respect to shape and/or gradient. The presence of amorphous regions increases device resistance, resulting in unwanted leakage and limited current flow. Typically, a high temperature annealing process that facilitates recrystallization of the underlying semiconductor material is conducted to reduce the presence of amorphous regions. However, a high temperature anneal may not be compatible with some materials, especially III-V materials which often dissociate at high temperatures. The embodiments disclosed herein were developed in response to these and other issues.

Figure 1:
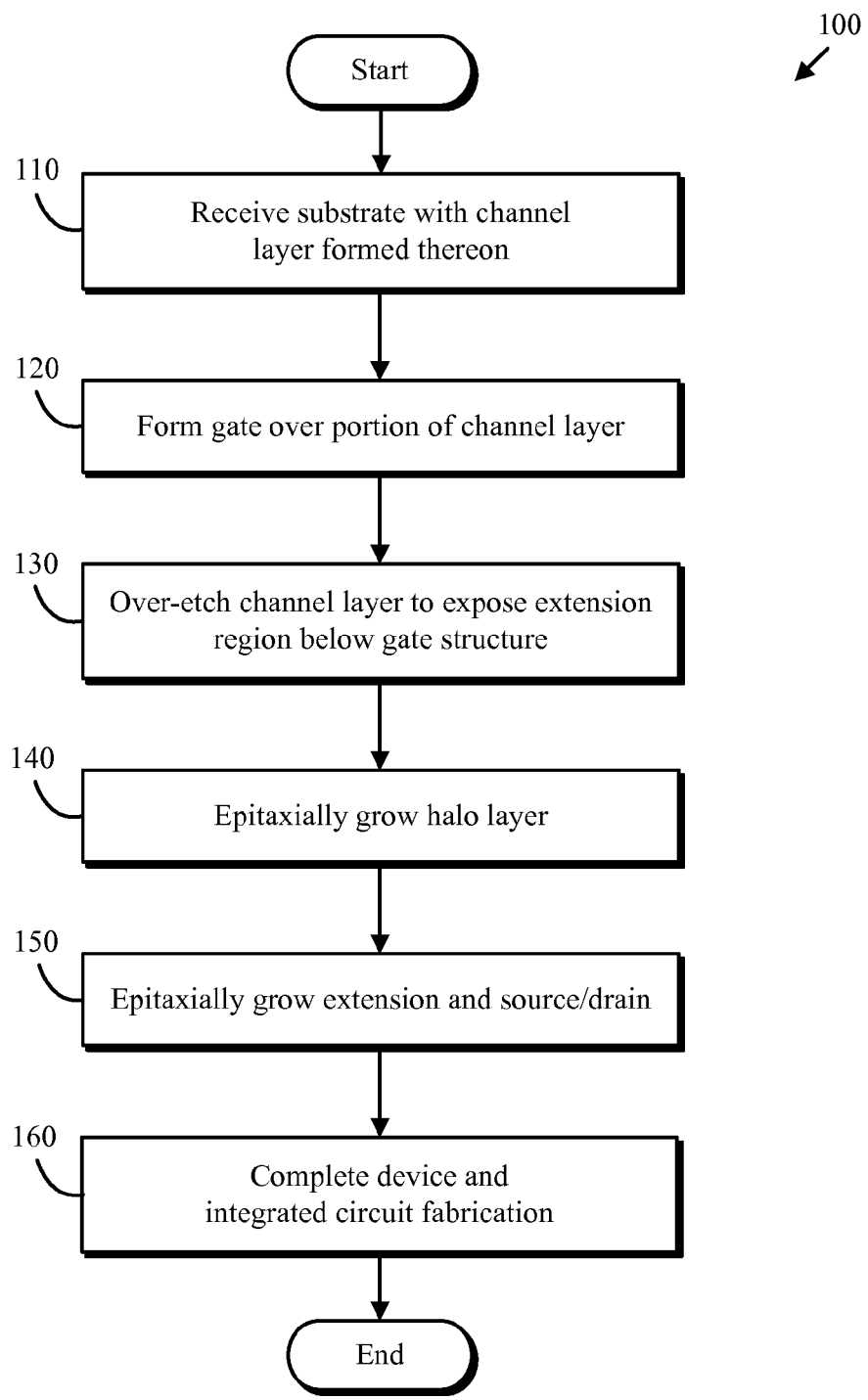
FIG. 1 is a flowchart depicting one embodiment of a method for fabricating a semiconductor device.

For example, FIG. 1 is a flowchart depicting one embodiment of a method 100 for fabricating a semiconductor device. As depicted, the method includes receiving (110) a substrate with a channel layer formed thereon, forming (120) a gate structure over a portion of the channel layer, over-etching (130) the channel layer to expose an extension region below the gate structure, epitaxially growing (140) a halo layer, epitaxially growing (150) an extension and source/drain, and completing (160) device and integrated circuit fabrication. The method 100 may be used to fabricate semiconductor devices with reduced leakage current.

Receiving (110) a substrate with a channel layer formed thereon may include receiving a wafer substrate with a channel layer formed over the substrate. The channel layer may be patterned to facilitate forming transistors on specific areas of the substrate. In one embodiment a layer of InAs is deposited on a substrate of InP and patterned to provide the channel layer. In some embodiments, fins are formed on the substrate and the channel layer is formed over the fins. For additional details on the receiving operation 110 and one embodiment of a corresponding structure, see FIG. 2 and the associated description.

Forming (120) a gate structure over a portion of the channel layer may include depositing and patterning a gate dielectric layer and one or more gate conductor layers. Examples of materials that can be used in the gate dielectric layer include $SiO_2$, HfO, ZrO, TaO, and other metal oxides. Examples of materials that can be used in the gate conductor layer(s) include TiN, TaN, W, Al and other metals. In some embodiments, a lateral spacer is formed on the sidewalls of the gate structure. Examples of lateral spacer materials include $SiO_2$, SiN, SiBN, SiCBN and other insulators. In some embodiments, a "dummy gate" is used as a placeholder for a "real gate." The structure created by the forming operation 120 is referred to herein as a 'gated substrate' in that completed semiconductor devices may be formed thereon. For additional details on the forming operation 120 and one embodiment of a corresponding structure, see FIG. 3 and the associated description.

Over-etching (130) the channel layer to expose an extension region below the gate structure may include conducting a dry etch process, a wet etch process, or a combination thereof. In one variation of the embodiment under discussion, a dry etch process is used to remove the channel layer that is outside of (i.e., lateral to) the gate structure and a wet etch process is conducted to etch under the gate structure and expose the extension region under a portion of the gate structure. In another variation of the embodiment under discussion, a dry etch is continued until the gate undercutting that exposes the extension region is fully performed. Exposing the extension region with a dry etch may include etching away a portion of the substrate. For additional details on the over-etching operation 130 and one embodiment of a corresponding structure, see FIGS. 4-5 and the associated description.

Epitaxially growing (140) a halo layer may include depositing, by epitaxial growth, a halo layer that covers the extension region. The halo layer may encompass the perimeter of the channel region of each transistor (thus the name "halo"). The material used to epitaxially grow the halo layer may be in-situ doped to provide a desired doping polarity and/or profile for the halo layer. For additional details on the epitaxial growth operation 140 and one embodiment of a corresponding structure, see FIG. 6 and the associated description.

Epitaxially growing (150) an extension and source/drain may include continuing the epitaxial growth with the same material started for the halo layer but changing the in-situ dopant to the polarity desired for the source and drain of the transistor. Alternatively, a different material, with different band gap, may be used. The in-situ dopants used in the halo layer and the source/drain may be of opposite polarity (i.e., dopant type) to provide an energy barrier for the resulting transistors. Examples of p-type in-situ dopants include Group II materials such as Zn, Be, and Mg. Examples of n-type dopants include Si, Zn, S, or other group VI or group IV materials. For additional details on the epitaxial growth operation 150 and one embodiment of a corresponding structure, see FIG. 7 and the associated description.

Completing (160) device and integrated circuit fabrication may include conducting additional steps and processes to provide packaged integrated circuits. For example, one of skill in the art will appreciate that the forgoing operations of the method 100 may be conducted on a wafer substrate to fabricate semi-conductor devices. Additional process steps may also be conducted to isolate the fabricated devices from each other and from additional layers including wiring layers. The wiring layers may provide electrical interconnections between the semiconductor devices by forming vias that connect selected wires (traces) to the semiconductor devices (e.g., the gate, source, and drain). The resulting interconnections may form a number of integrated circuits on the wafer which may be diced and packaged to provide packaged integrated circuits.

Figure 2:
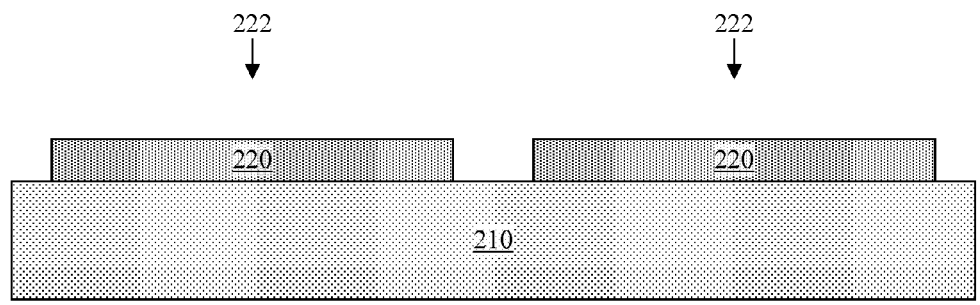
FIGS. 2 through 7 are cross-sectional view illustrations of a semiconductor device at various stages of processing for one embodiment of the method of FIG. 1.

FIGS. 2 through 7 are cross-sectional view illustrations of a semiconductor device at various stages of processing for one embodiment of the method of FIG. 1. As shown in FIG. 2, a substrate 210 such as a wafer may be provided with a channel layer 220 at specific locations 222 where a semiconductor device, such as a transistor, is to be fabricated. In certain embodiments, the substrate is a finned substrate. For example, as understood by those of skill in the art, fins may be formed by etching trenches into the substrate or by depositing additional material onto the substrate in selected areas.

The substrate 210 may be made of a semiconductor material including a compound semiconductor material. In some embodiments, the substrate comprises a III-V compound material such as InP. In other embodiments, the substrate comprises a II-VI compound material such as ZnO. In yet other embodiments, the substrate comprises a group IV material. In some embodiments, the substrate 210 includes a barrier (i.e., isolation) layer that isolates the (surface) regions where the devices are fabricated from a bulk substrate. The channel layer 220 may be made of an undoped semiconductor material (e.g., InAs) that is complementary to the substrate material (e.g., InP).

Figure 3:
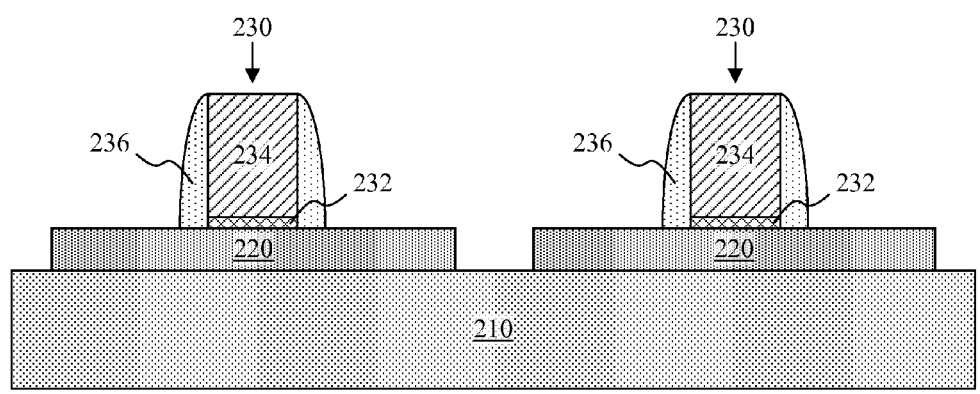

As shown in FIG. 3, one or more gate structures 230 may be formed over the channel layer 220. In the depicted embodiment, the gate structure 230 includes a gate dielectric layer 232, one or more gate conductive layer(s) 234, and lateral spacers 236. The gate dielectric layer 232 may electrically isolate the gate conducting layer(s) 234 from the channel layer 220. The lateral spacer 236 is formed and used to provide a space between the source/drain and the gate and thereby prevent shorts between source/drain and the gate.

Figure 4:
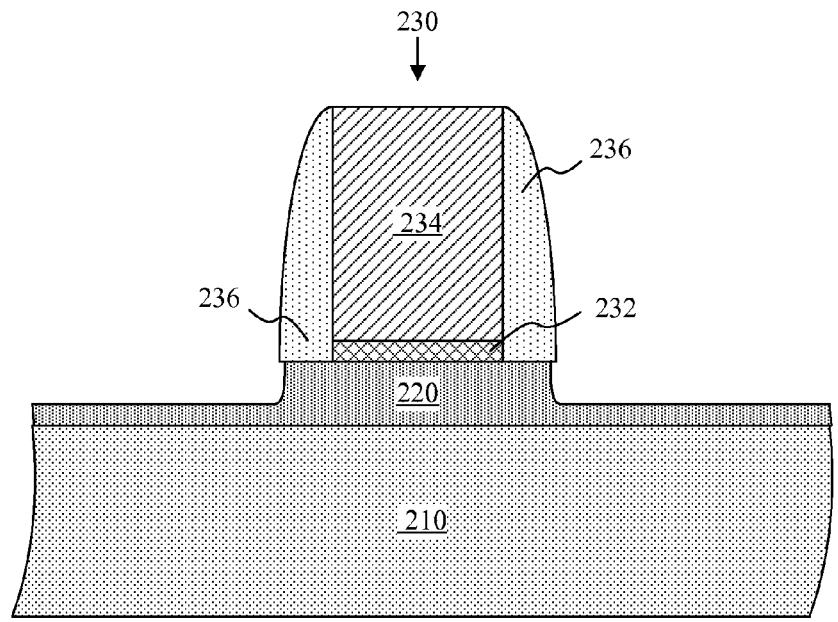
Figure 5:
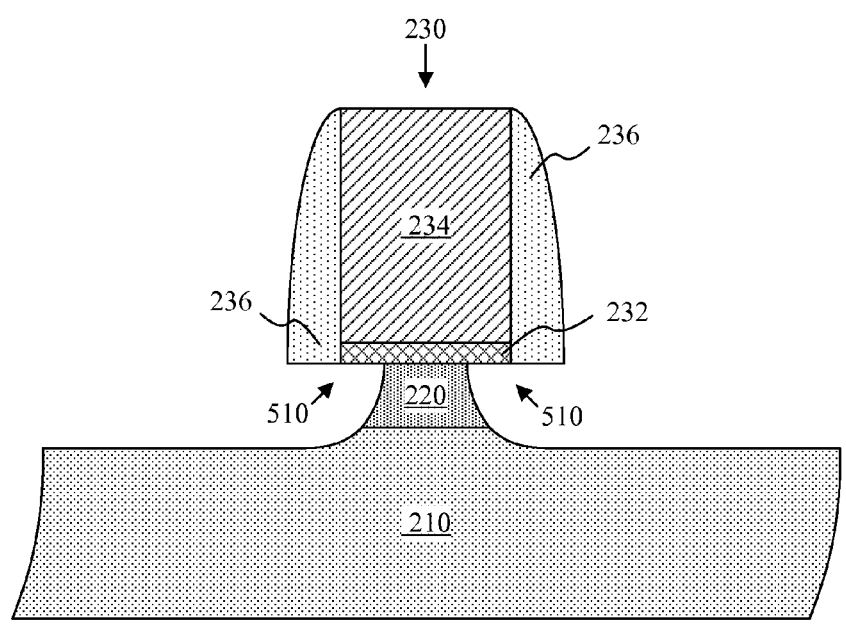

As shown in FIG. 4, the channel layer 220 may be etched to remove the channel layer lateral to the gate structure 230 and then continued (e.g., over-etched) as shown in FIG. 5 to expose a gate extension region 510 under the gate structure 230. In some embodiments, the continued etching removes a portion of the substrate 210 and undercuts (i.e., exposes) an outer lower portion of the gate dielectric layer 232 that corresponds to the gate extension region 510. In other embodiments, the continued etching leaves the substrate 210 substantially intact.

Figure 6:
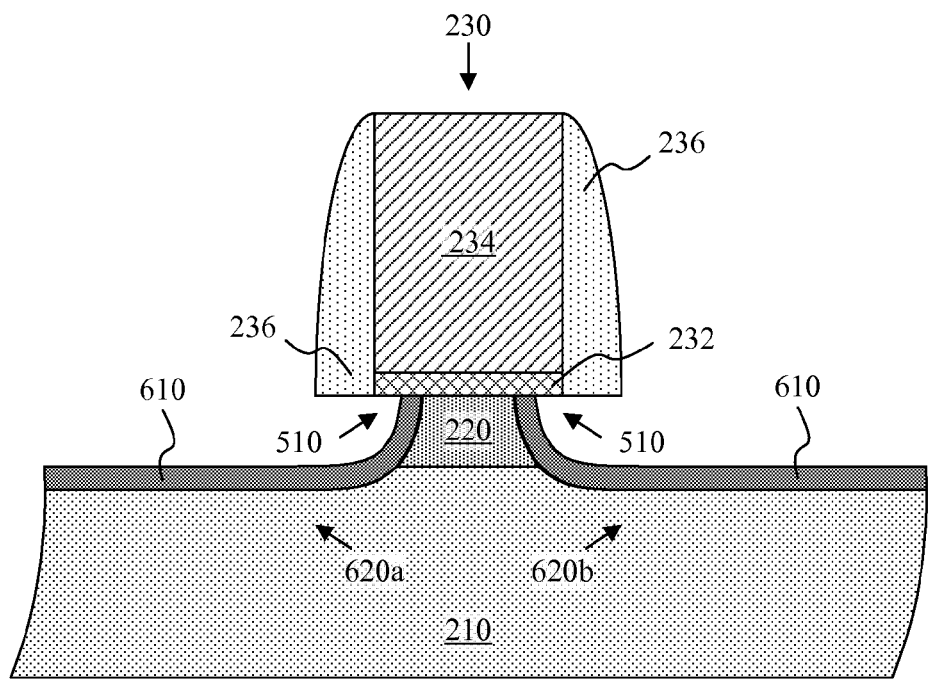

As shown in FIG. 6, a halo layer 610 may be epitaxially grown onto the perimeter of the (remaining portion of the) channel layer 220 as well as a source region 620a and drain region 620b (referred to collectively as the source/drain region 620). During epitaxial growth of the halo layer 610, a doping concentration of an in-situ dopant may be varied to provide a doping gradient within the halo layer.

The halo layer 610 may laterally overlap and extend outward from underneath the gate structure 230 on both the source and drain sides of the device. The overlapping region may correspond to the extension region of the device. In some embodiments, the halo layer 610 laterally overlaps the gate dielectric layer 232 and the gate conducting layer(s) 234.

Figure 7:
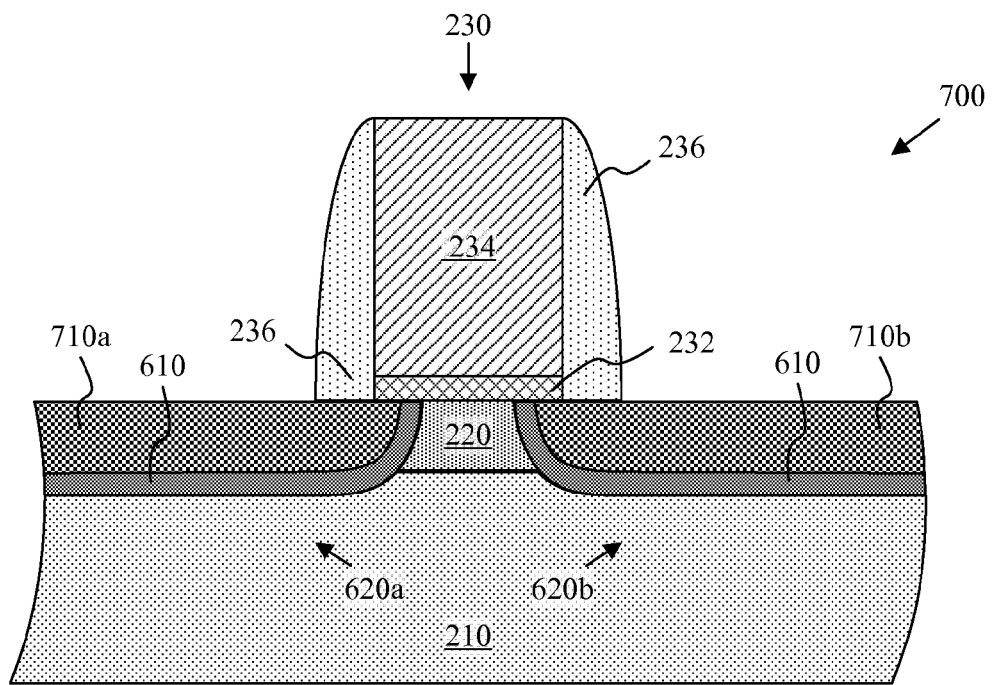

Subsequently, as shown in FIG. 7, a source 710a and a drain 710b (referred to collectively as the source/drain 710) may be epitaxially grown over the halo layer 610 to form a semiconductor device 700. In this embodiment, the halo layer 610 and source/drain 710 are substantially completely crystalline (that is, substantially free of amorphous regions) due to epitaxial growth.

The in-situ dopant used when epitaxially growing the source/drain 710 may have an opposite polarity of the in-situ dopant used when epitaxially growing the halo layer 610. For example, an n-type dopant may be used for the halo layer of a PFET device and a p-type dopant may be used for the halo layer of an NFET device. Using an in-situ dopant with an opposite polarity in the halo layer may provide an energy barrier to the resulting semiconductor device 700 and reduce leakage current in the device.

In certain embodiments, the halo layer 610 substantially modifies a bandgap for the resulting semiconductor device 700. In other embodiments, the halo layer does not substantially modify a bandgap for the semiconductor device 700. In one embodiment, an undoped InAs channel layer 220 is formed over an InP substrate 210 and the halo layer 610, as well as the source/drain 710, are epitaxially grown (using InGaAs) to form an NFET device 700. In this embodiment, Zn is used as a p-type dopant for the halo layer with a concentration range of $1\times10^{18}$ cm$^{-3}$ to $5\times10^{18}$ cm$^{-3}$. For the source/drain 710, Silicon is used as an n-type dopant with a concentration range of $1\times10^{19}$ cm$^{-3}$ to $1\times10^{21}$ cm$^{-3}$.

In addition to the steps and operations disclosed herein, additional steps and operations may be performed while retaining the spirit and intent of the disclosed embodiments. Also, it should be noted that the apparatuses disclosed herein may be integrated with additional circuitry within integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method to fabricate a semiconductor device, the method comprising:
   receiving a gated substrate comprising a substrate with a channel layer and a gate structure formed thereon;
   etching the channel layer to expose an extension region below the gate structure;
   epitaxially growing a halo layer on the exposed extension region that laterally overlaps the gate using a first in-situ dopant; and
   epitaxially growing a source or drain on the halo layer using a second in-situ dopant that has an opposite doping polarity than the first in-situ dopant.

2. The method of claim 1, wherein the halo layer provides an energy band barrier for the semiconductor device.

3. The method of claim 1, wherein the gate structure comprises a dummy gate or real gate.

4. The method of claim 1, wherein the gated substrate comprises one or more fins.

5. The method of claim 1, wherein the channel layer is undoped.

6. A method to fabricate a semiconductor device, the method comprising:
   receiving a gated substrate comprising a substrate with a channel layer and a gate structure formed thereon;
   etching the channel layer to expose an extension region below the gate structure;
   epitaxially growing a halo layer on the exposed extension region using a first in-situ dopant;
   epitaxially growing a source or drain on the halo layer using a second in-situ dopant that has an opposite doping polarity than the first in-situ dopant; and
   wherein the channel layer comprises a group III material and a group V material.

7. The method of claim 6, wherein the halo layer provides an energy band barrier for the semiconductor device.

8. The method of claim 6, wherein the gate structure comprises a dummy gate or real gate.

9. The method of claim 6, wherein the gated substrate comprises one or more fins.

10. The method of claim 6, wherein the channel layer is undoped.

11. A method to fabricate a semiconductor device, the method comprising:
    receiving a gated substrate comprising a substrate with a channel layer and a gate structure formed thereon;
    etching the channel layer to expose an extension region below the gate structure;
    epitaxially growing a halo layer on the exposed extension region using a first in-situ dopant;
    epitaxially growing a source or drain on the halo layer using a second in-situ dopant that has an opposite doping polarity than the first in-situ dopant; and
    wherein the source or drain comprises a group III material and a group V material.

12. The method of claim 11, wherein the halo layer provides an energy band barrier for the semiconductor device.

13. The method of claim 11, wherein the gate structure comprises a dummy gate or real gate.

14. The method of claim 11, wherein the gated substrate comprises one or more fins.

15. The method of claim 11, wherein the channel layer is undoped.

16. A method to fabricate a semiconductor device, the method comprising:
    receiving a gated substrate comprising a substrate with a channel layer and a gate structure formed thereon;
    etching the channel layer to expose an extension region below the gate structure;
    epitaxially growing a halo layer on the exposed extension region using a first in-situ dopant;
    epitaxially growing a source or drain on the halo layer using a second in-situ dopant that has an opposite doping polarity than the first in-situ dopant; and
    wherein a concentration of the first in-situ dopant is varied to provide a doping gradient in the halo layer.

17. The method of claim 1, wherein the halo layer provides an energy band barrier for the semiconductor device.

18. The method of claim 1, wherein the gate structure comprises a dummy gate or real gate.

19. The method of claim 1, wherein the gated substrate comprises one or more fins.

20. The method of claim 1, wherein the channel layer is undoped.

* * * * *